United States Patent [19]
Conway et al.

[11] Patent Number: 5,296,815
[45] Date of Patent: Mar. 22, 1994

[54] DEVICE FOR DETECTING THE TYPE OF BALLAST OF A DISCHARGE LAMP

[75] Inventors: Kathryn M. Conway, North Chatham; Peter Boyce, Ballston Lake; Kenneth Sasiadek, Nassau, all of N.Y.

[73] Assignee: Rensselaer Polytechnic Institute, Troy, N.Y.

[21] Appl. No.: 913,653

[22] Filed: Jul. 14, 1992

[51] Int. Cl.⁵ .............. G01R 23/16; G01R 31/00; G01R 19/14; G01R 27/02
[52] U.S. Cl. ............................ 324/414; 324/133; 324/76.13
[58] Field of Search .......... 324/133, 414, 403, 76.31, 324/76.36; 315/291; 250/214 AL, 227.23

[56] References Cited

U.S. PATENT DOCUMENTS 4,812,743 3/1989 Morrison ............................ 324/76.31
5,142,142 8/1992 Senechello ...................... 250/227.23

Primary Examiner—Walter E. Snow
Attorney, Agent, or Firm—John F. McDevitt

[57] ABSTRACT

A portable inspection device is disclosed enabling a user to identify what type ballast means are being employed to operate gaseous discharge lamps. Magnetic ballasts are distinguished from electronic ballasts in such manner by simply inspecting the lamp illumination from a remote location.

8 Claims, 1 Drawing Sheet

DEVICE FOR DETECTING THE TYPE OF BALLAST OF A DISCHARGE LAMP

BACKGROUND OF THE INSPECTION

This invention relates generally to inspection means for a particular type lamp installation and, more particularly, to a portable inspection device enabling a user to distinguish between the different ballast means now being employed to operate gaseous discharge lamps.

Gaseous discharge lamps require an auxiliary voltage-current control means commonly termed a ballast as a necessary part of lamp operation. Various types of such lamps including mercury discharge lamps, fluorescent lamps and sodium vapor lamps all employ such ballast means to interface between the alternating current supply and the particular lamp with such ballast means starting and stabilizing the lamp operation as well as controlling lamp wattage as the line voltage varies. Fluorescent lamp ballasts and other type ballasts are known with individual ballast means operating two or more lamps. Various magnetic ballasts initially employed for such lamp operation experience a significant power loss often exceeding 10-20 percent which has caused their replacement with low power loss electronic ballasts to some degree. Such electronic ballasts employing semiconductor devices are thereby becoming more common place since they have generally further proved lighter in weight and smaller in size than a magnetic counterpart for the same lamp.

Recognizing the greater energy efficiency being realized with electronic ballast operation, electric utility companies are beginning to offer financial incentives to lamp installations using the electronic ballast. It thereby becomes desirable to provide an efficient and effective means whereby such lamp installations can be inspected to determine the proportion of electronic ballasts in a particular lamp installation. In doing so, a portable inspection device enabling such inspection to be carried out from a convenient remote location not requiring electrical connection to the lamp ballast would be further desirable. A known inspection device meeting these objectives and called a "Light Listener" transforms the pulsating or flickering light produced during lamp operation into sound that can be heard by the inspector. Said prior art device employs a phototransistor as the sensor means which is operatively associated with solid state circuit means connected to the microphone input of a battery powered audio amplifier. Simply pointing this listening device at an operating fluorescent lamp installation, for example, is said to produce an audible buzzing sound. Since the utility of such device necessarily depends upon the hearing ability of a human listener, however, it remains desirable to provide a still more effective means of distinguishing between magnetic and electronic ballast means. Said prior art device is believed further unable to distinguish between different types of fluorescent lamps.

It is an object of the present invention, therefore, to provide a device enabling identification of the type ballast means for a gaseous discharge lamp by visually discernable means.

It is another object of the present invention to provide such detection with optoelectronic circuit means employing lamp devices as the means for indication.

Still another object of the present invention is to include further lamp means in the device serving to indicate when light is being received at an identifiable intensity level.

These and still further objects of the present invention will become more apparent upon considering the following detailed description of the present invention.

SUMMARY OF THE INVENTION

Novel detection means have now been discovered enabling a user to distinguish between magnetic and electronic ballasts being employed to operate gaseous discharge lamps in a unique manner. Generally, such novel inspection device utilizes (a) sensor means converting the light output of said gaseous discharge lamp to a variable frequency output voltage, (b) frequency selective circuit means providing a voltage output signal depending upon the frequency of the sensor output voltage, and (c) lamp indicating means actuated with the voltage output signal from said frequency selective circuit means. Suitable sensor means which can be used in the present device comprise such photoreceptive devices as phototransistors, photodiodes and even solar cells. Assembling the above listed device components together within a portable housing member so that the selected sensor means is left exposed enables an inspector to simply point the unit at operating lamps in the particular installation being monitored. Proper aiming of said unit can further be helped if additional lamp indicating means are included, such as a light emitting diode, to indicate sufficient light being received by the sensor means. Light fluctuations caused by the particular operating frequency of the ballast means for the inspected lamp is thereby automatically detected with the employed sensor means.

The frequency selective circuit means in the present device provides a voltage output signal depending upon the bandwidth of frequencies present in the input voltage signal being transmitted with the employed sensor means. Thus, only preselected frequency bandwidths serve to actuate the operatively associated lamp indication means in the present device enabling a distinction to be made between the respective lamp ballasts involved. Such distinction occurs since magnetic lamp ballasts operate in a relatively low frequency bandwidth up to about 120 Hertz whereas electronic lamp ballasts operate at a much higher frequency bandwidth greater than 17.5 Kilohertz. Known electrical filter circuits providing voltage output signals only in the indicated frequency bandwidth ranges can thereby be utilized for actuation of the associated lamp indicating means. For example, commercially available low-pass filter circuit means with a cut-off point at approximately 120 Hertz can serve to actuate a further conventional photodiode device indicating operation of a detected magnetic ballast. Likewise, further commercially available high-pass filter circuit means with a cut-off point at approximately 17.5 Kilohertz can be similarly employed for the detection of electronic ballast operation. Incorporating both type filter circuits in the same frequency selective circuit means for actuation of said lamp devices can thereby enable the same inspection device to detect magnetic ballasts as well as electronic ballasts during lamp operation. Implementing said foregoing frequency selective circuit means together with the operatively associated sensor and lamp indicating means can primarily be carried out with already known solid state circuit components to be herein after further described with respect to the illustrated device embodiments. In such device configurations, the lamp indicating means being utilized can also be solid state devices such as light emitting diodes and the like.

BRIEF DESCRIPTION OF THE ACCOMPANYING DRAWING

The accompanying drawing is an electrical schematic diagram for a typical inspection device of the present invention.

DETAILED DESCRIPTION OF THE PREFERRED EMBODIMENTS

Figure 1:
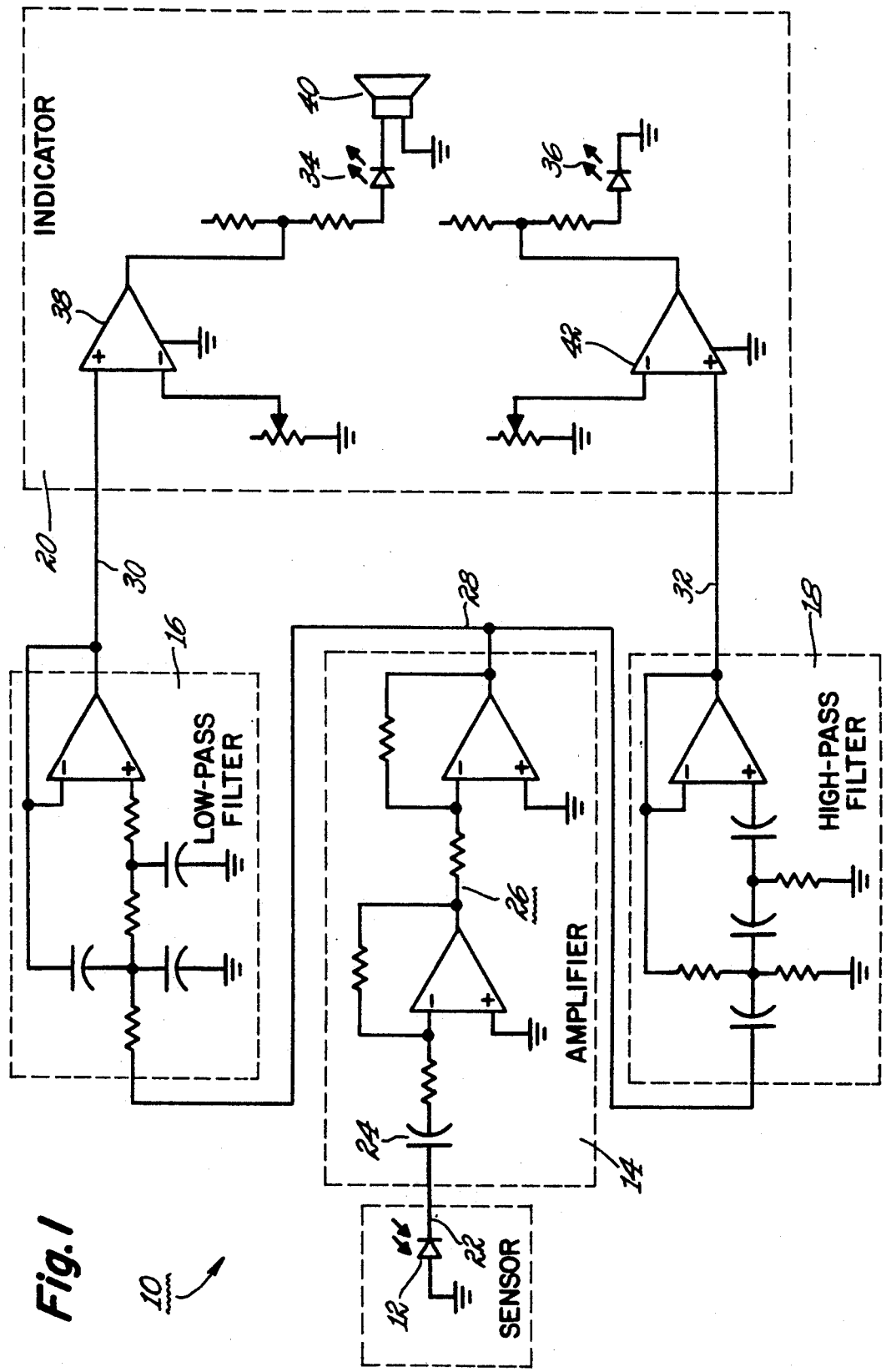

Referring now more specifically to the accompanying drawing, an electrical schematic diagram is shown depicting typical structural components and circuit means which can be employed in the present inspection device. Accordingly, said optoelectronic solid state device 10 includes PIN diode sensor means 12, amplifier circuit 14, low-pass filter network 16, high-pass filter network 18 and lamp indicating means 20. A variable frequency output voltage 22 is transmitted from said PIN diode in response to the light output being provided during lamp inspection. The cut-off angle for the reception of light is equal to or less than ten degrees. A capacitor element 24 in the amplifier circuit 14 removes any transient direct current voltage which may be included in the variable frequency output voltage signal 22. The resulting voltage signal is applied to a two-stage solid state amplifier means 26 included in the amplifier circuit 14, such as with series-paired LF356N monolithic operational amplifiers being market by National Semiconductor Corporation. The voltage signal being processed in said amplifier circuit produces an output signal 28 having a value around 2 volts AC. Said output voltage signal 28 is next processed in the parallel connected filter networks 16 and 18, which each can again employ single stage LF356N amplifier devices. Low-pass filter network 16 provides an output voltage signal 30 limited to a frequency bandwidth from zero up to a cut-off point of approximately 120 Hertz with an additional frequency separation being made to the input voltage signal 28 by means of further cooperating high-pass filter network 18. The latter network provides an output voltage signal 32 limited to a frequency bandwidth exceeding approximately 17.5 KHz while rejecting lower bandwidth frequency signals. As can be further noted in the present drawing with respect to said filter networks 16 and 18, a similar relationship exists between the various resistor and capacitor element interconnections. Thus, low-pass filter network 16 can be converted to high-pass filter network 18 when a simple interchange of the resistor and capacitor components between these networks takes place in accordance with known considerations applicable to such type networks.

Output voltage signals 30 and 32 emerging from the bifurcated filter networks in the circuitry being illustrated both require amplification to approximately 2.2 volts in magnitude for lamp actuation in the further associated lamp indicating circuit means 20. Said lamp indicating circuit means 20 employs a pair of separately actuated light emitting diodes 34 and 36 which identify which type ballast is being responded to and said diode devices can emit different color illumination (red and green) to further assist with such ballast identification. Accordingly, output voltage signal 30 serves after amplification to actuate diode 34 thereby signifying detection of an operating magnetic ballast. In doing so, said output voltage signal is first applied to solid state voltage comparator means 38, such as Model LM339 device also being marketed by National Semiconductor Corporation, in order to provide the desired voltage amplification. An optional audio amplifier device 40 has further been included in said indicating circuit means 20 for simultaneous actuation with diode element 34 and which can serve in identifying magnetic ballast operation with both sound as well as illumination. In a similar manner, output voltage signal 32 emerging from the high-pass filter network 18 serves to actuate remaining diode element 36 in said lamp indicating circuit means 20 and thereby provide notification of an operating electronic ballast. Said output voltage signal 32 is first amplified in solid state voltage comparator means 42, such as the aforementioned LM339 device, with the amplified signal then being applied to diode element 36. As can be further noted in the present drawing, each of the voltage comparator means being employed for voltage amplification in the illustrated lamp indicating circuit means does so with a comparison of the filter output voltage to a voltage established with associated variable resistor means (unnumbered).

It will be apparent from the foregoing description that a broadly useful discharge lamp inspection device has been disclosed to more effectively discern the identification of ballast means now being employed to operate gaseous discharge lamps. It will also be apparent that modifications can be made in the specific circuit means and circuit components being employed in said device, however, without departing from the spirit and scope of the present invention. For example, it is contemplated that additional lamp indicating means be provided in said device for a notification to the user that the device is receiving a sufficient light intensity level from the particular lamp installation being inspected. Additionally, it is contemplated that alternative frequency filtering means can replace the illustrated high and low pass filter networks, such as already known frequency comparator integrated circuit devices. Consequently, it is intended to limit the present invention only by the scope of the appended claims.

What we claim as new and desire to secure by Letters Patent of the United States is:

1. A device enabling detection of the operating frequency for the ballast means of a gaseous discharge lamp from a remote location which comprises:
   (a) sensor means converting the light output of said gaseous discharge lamp to a variable frequency output voltage, said sensor means being unconnected to said discharge lamp,
   (b) frequency selective circuit means which include a low-pass response providing a voltage output signal at relatively low-frequencies in combination with a high-pass response providing a voltage output signal at relatively high frequencies, while also removing any transient direct current voltage, and
   (c) multiple lamp indicating means for separate lamp actuation with each voltage output signal from said frequency selective circuit means.

2. The device of claim 1 wherein the sensor means comprises a light receiving photodiode.

3. The device of claim 1 wherein the frequency selective circuit means comprises a two stage operational amplifier circuit for receipt of the variable frequency output voltage signal from the sensor means which is operatively associated with a low-pass filter network and a high-pass filter network.

4. The device of claim 3 wherein capacitor means are included in said amplifier circuit to remove any transient direct current voltage in the sensor output voltage.

5. The device of claim 1 wherein light emitting diodes are actuated with the lamp indicating means.

6. The device of claim 3 wherein the voltage output signals derived in the frequency selective circuit means are further amplified in the lamp indicating circuit means.

7. The device of claim 1 which further includes sound-producing means simultaneously actuated with an individual light emitting diode in the lamp indicating circuit means.

8. An optoelectronic device enabling selective identification of magnetic and electronic ballast means operating a gaseous discharge lamp from a remote location which comprises:

(a) light-receiving photodiode sensor means converting the light output of said gaseous discharge lamp to a variable frequency output voltage, said sensor means being unconnected to said gaseous discharge lamp, (b) frequency selective circuit means including a two-stage amplifier circuit for receipt of the variable output signal from the sensor means while also removing any transient direct current voltage which is operatively associated with a low-pass filter network responding in the operating frequency bandwidth range for said magnetic ballast as well as a high-pass filter network responding in the operating frequency bandwidth range for said electronic ballast, and (c) multiple light emitting diode indicating circuit means having one of said diode devices being actuated with an output voltage signal derived in the low-pass filter network while another of said diode devices is separately actuated with an output voltage signal derived in the high-pass filter network.

* * * * *